United States Patent [19]

Ohkubo

[11] 4,352,203
[45] Sep. 28, 1982

[54] STATION SELECTING DEVICE

[75] Inventor: Wataru Ohkubo, Soma, Japan

[73] Assignee: Alps Electric Company, Ltd., Tokyo, Japan

[21] Appl. No.: 175,952

[22] Filed: Aug. 7, 1980

[30] Foreign Application Priority Data

Aug. 11, 1979 [JP] Japan ............................ 54-110843[U]

[51] Int. Cl.³ ............................ H04B 1/16; H03J 5/32
[52] U.S. Cl. ...................................... 455/176; 334/15; 455/180
[58] Field of Search ............... 455/150, 175, 176, 179, 455/180, 195, 199, 77; 358/191.1; 334/11, 14, 15, 87

[56] References Cited

U.S. PATENT DOCUMENTS 3,801,915 4/1974 Ostuni et al. .

FOREIGN PATENT DOCUMENTS 2814906 10/1978 Fed. Rep. of Germany ........ 334/15

Primary Examiner—Marc E. Bookbinder
Attorney, Agent, or Firm—Guy W. Shoup; Gerard F. Dunne

[57] ABSTRACT

A station selecting device which comprises: a plurality of variable resistors, grouped into several reception bands, the variable resistors in each group being connected in parallel; band selection switches for selectively supplying power to the variable resistors of the desired band; and channel selection switches for picking up the tuning voltage across the selected variable resistor, said each channel selection switch being connected to one of variable resistors of each band. Since each channel selection switch is connected to the variable resistor of each band, the number of the channel selection switches required are very few as compared with the conventional device, which in turn reduces the size of the device and makes the construction simple.

2 Claims, 2 Drawing Figures

STATION SELECTING DEVICE

BACKGROUND OF THE INVENTION

The present invention relates to a station selecting device in which the tuning voltage is selectively supplied to an electronic tuner to tune in the desired station.

In the conventional device —for example, CATV in the United States—a number of variable resistors with respective fixed resistors connected to each end thereof are grouped into three bands as shown in FIG. 1, i.e., 2nd to 13th channels, A- to L-channels, and M- to W-channels. Each variable resistor produces a tuning voltage that corresponds to a certain channel. Assigned to the 2nd to 13th channels are variable resistors $7a \ldots 7n$ with resistors $1a \ldots 1n$ and $2a \ldots 2n$ connected to respective ends. For A- to L-channels are used a group of variable resistors $8a \ldots 8n$ having resistors $3a \ldots 3n$ and $4a \ldots 4n$ connected to their respective ends. For M- to W-channels, variable resistors $9a \ldots 9n$ with resistors $5a \ldots 5n$ and $6a \ldots 6n$ connected at their ends are used. The resistors of each band are connected in parallel with each other. The resistors $1a \ldots 1n$, $3a \ldots 3n$ and $5a \ldots 5n$ are connected at one end to the terminal 15 which in turn is connected to the power source. The resistors $2a \ldots 2n$, $4a \ldots 4n$, and $6a \ldots 6n$ are connected at one end to the terminal 16 which is grounded. The variable resistors $7a \ldots 9n$ are connected through their sliders to channel selection switches $10a \ldots 12n$ which in turn are connected to a band selection switch 13. The movable contact of the band selection switch 13 is connected to the output terminal 14.

To tune in a desired channel, the band selection switch 13 is changed over to the band containing the resistor that produces the tuning voltage corresponding to the desired channel and at the same time one of the channel selection switches $10a \ldots 12n$ which corresponds to the desired channel is closed. This supplies the tuning voltage to the electronic tuner through the terminal 14, thereby tuning in the desired channel. The channel selection switches $10a, 11a, 12a$ are linked with the corresponding channel selection switches $10b, 11b, 12b, \ldots$, and $10n, 11n, 12n$ so that each group of corresponding switches move simultaneously.

Since it is necessary to provide a channel selection switch for each variable resistor, the conventional device is complex in construction and large in size and requires a large number of component parts pushing up the production cost.

SUMMARY OF THE INVENTION

An object of this invention is to provide a station selecting device which eliminates the above drawbacks and in which the number of the channel selection switches are greatly reduced to make the construction simple and compact.

To achieve this objective a station selecting device of this invention comprises: a plurality of variable resistors, grouped into several reception bands, the variable resistors in each group being connected in parallel; band selection switches for selectively supplying voltage to the variable resistors of the desired band; and channel selection switches for picking up the tuning voltage across the selected variable resistor, said each channel selection switch being connected to one of variable resistors of each band.

DESCRIPTION OF THE PREFERRED EMBODIMENT

Figure 1:
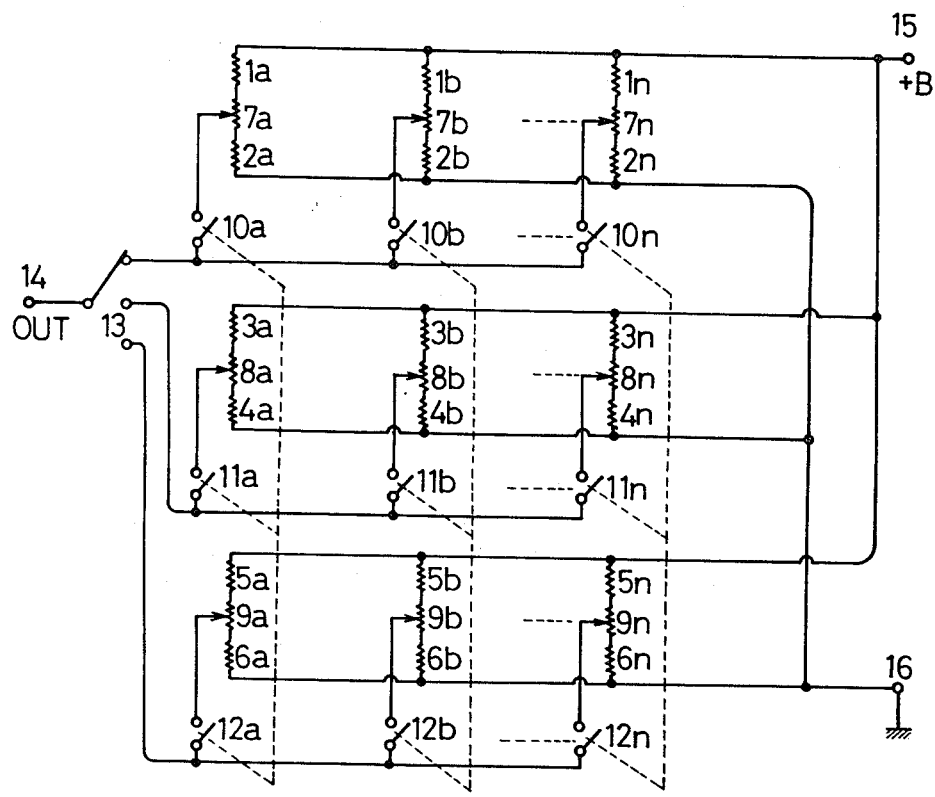
FIG. 1 is a circuit of the conventional station selecting device.
Figure 2:
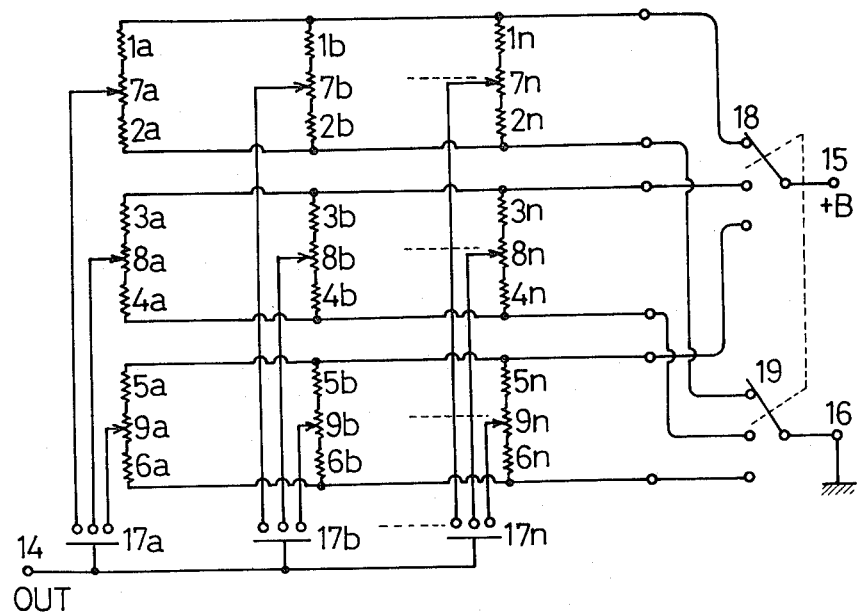
FIG. 2 is a circuit of one embodiment of the station selecting device according to this invention.

The present invention will now be described with reference to the accompanying drawings. Referring to FIG. 2, a rheostat or variable resistor $7a$ is connected at both ends with respective resistors $1a$, $2a$ to form a resistor unit that produces a voltage corresponding to a given channel. A number of resistor units are divided, for example in the case of CATV in the United States, into three bands; from 2nd to 13th channels, from A- to L-channels, and from M- to W-channels. Used for the 2nd to 13th channels are a group of resistor units consisting of variable resistors $7a \ldots 7n$ fitted at both ends with respective resistors $1a \ldots 1n$ and $2a \ldots 2n$. For the A- to L-channels, a group of variable resistors $8a \ldots 8n$ having resistors $3a \ldots 3n$ and $4a \ldots 4n$ connected to their respective ends are used. Assigned to the M- to W-channels are a group of resistor units consisting of variable resistors $9a \ldots 9n$ having resistors $5a \ldots 5n$ and $6a \ldots 6n$ connected to their respective ends. For each band, a group of resistor units are connected in parallel with each other. Each group of resistors $1a \ldots 1n$, $3a \ldots 3n$, and $5a \ldots 5n$ are connected at one end to one of the three stationary contacts of a band selection switch 18 that selectively feeds the supply voltage to any group of the resistors. And each group of resistors $2a \ldots 2n$, $4a \ldots 4n$, and $6a \ldots 6n$ are connected at one end to one of the three stationary contacts of another band selection switch 19 that selectively connects any group of resistors to the ground. The two band selection switches 18, 19 are linked with each other for simultaneous movement, and the movable contacts of these switches 18, 19 are connected to the power supply and the ground respectively so that when the supply voltage is applied to one end of the group of resistors in the band selected the other end of that group of resistors is grounded.

The variable resistors $7a$, $8a$, $9a$ are connected through their sliders to the channel selection switch $17a$, the variable resistors $7b$, $8b$, $9b$ to the channel selection switch $17b$, and so on. Likewise variable resistors $7n$, $8n$, $9n$ are connected to the channel selection switch $17n$. The movable contacts of the channel selection switches $17a \ldots 17n$ are connected to the output terminal 14.

To tune in a certain station, the band selection switches 18, 19 are changed over to the desired band to supply voltage to the group of resistors of the band, and one of the channel selection switches $17a \ldots 17n$ is operated to select the variable resistor which provides a tuning voltage corresponding to the desired station. If, for example, the channel selection switch $17a$, to which the sliders of the variable resistors $7a$, $8a$, $9a$ are connected, is closed, the voltage across the variable resistor $7a$ is applied to the electronic tuner through the terminal 14 because in the case shown in FIG. 2 only the group of variable resistors $7a \ldots 7n$ are supplied with power. This tunes in the station corresponding to the tuning voltage obtained from that variable resistor $7a$.

As can be seen in the foregoing, since each of the channel selection switches is connected to one of the variable resistors of each band, the number of channel selection switches required is greatly reduced (to about one third as compared with the conventional device) resulting in a simpler construction, smaller size and reduced cost. Furthermore, this invention has another advantage that the current is passed through a group of resistors of the selected band only, instead of supplying current to all the resistors as in the conventional device, and the load on the power supply is reduced.

What is claimed is:

1. A device for selecting a desired channel from among a plurality of channels grouped into bands each containing a predetermined number of said channels; comprising a plurality of variable resistors each corresponding to a respective channel and connected so that the variable resistors corresponding to the channels of each band are connected in a respective parallel circuit with one another; supply means for selectively applying a voltage to each resistor of the parallel circuit containing a variable resistor corresponding to the desired channel, said supply means including a first switch for connecting a source of voltage to each resistor of the parallel circuit containing a variable resistor corresponding to the desired channel and a second switch for grounding each of said resistors connected to said source of voltage; and means including a plurality of channel switches each connected to one variable resistor only within each parallel circuit for enabling the desired channel to be selected by actuating only said supply means and an appropriate channel switch.

2. A device according to claim 1, said first and second switches being interconnected for simultaneous actuation by actuating only one thereof.

* * * * *